US008781401B2

United States Patent
Nallapureddy et al.

(10) Patent No.: US 8,781,401 B2
(45) Date of Patent: *Jul. 15, 2014

(54) DETECTION AND ESTIMATION OF RADIO FREQUENCY VARIATIONS

(71) Applicant: Marvell World Trade Ltd., St. Michael (BB)

(72) Inventors: Bhaskar W. Nallapureddy, Sunnyvale, CA (US); Songping Wu, Sunnyvale, CA (US); Tsunglun Yu, Cupertino, CA (US); Hui-Ling Lou, Palo Alto, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 13/730,420

(22) Filed: Dec. 28, 2012

(65) Prior Publication Data

US 2013/0113645 A1    May 9, 2013

Related U.S. Application Data

(63) Continuation of application No. 12/825,775, filed on Jun. 29, 2010, now Pat. No. 8,346,174, which is a continuation of application No. 11/493,473, filed on Jul. 26, 2006, now Pat. No. 7,747,222.

(60) Provisional application No. 60/749,222, filed on Dec. 9, 2005.

(51) Int. Cl.
*H04B 7/00* (2006.01)

(52) U.S. Cl.
USPC ............ 455/66.1; 342/13; 342/20; 324/76.11

(58) Field of Classification Search
CPC ................................ G01R 23/10; G01S 7/021
See application file for complete search history.

(56) References Cited

U.S. PATENT DOCUMENTS

| 4,593,287 A | 6/1986 | Nitardy |
| 5,656,849 A | 8/1997 | Burghartz et al. |

(Continued)

FOREIGN PATENT DOCUMENTS

| EP | 0284498 | 9/1988 |
| EP | 1793241 | 6/2007 |

(Continued)

OTHER PUBLICATIONS

ANSI/IEE Std 802.11, 1999 Edition; Information technology—Telecommunications and information exchange between systems—Local and metropolitan area networks—Specific requirements—Part 11: Wireless LAN Medium Access Control (MAC) and Physical Layer (PHY) Specifications; LAN/MAN Standards Commitrr of the IEEE Computer Society; 528 pages.

(Continued)

*Primary Examiner* — Zhiyu Lu

(57) ABSTRACT

A system including a counting module, a difference module, and a radar module. The counting module counts polarity reversals of samples of a signal. The samples are generated during a first period, a second period, and a third period. The counting module generates a first count, a second count, and a third count of the polarity reversals counted during the respective periods. The difference module determines a first difference between the first count and the second count, a second difference between the second count and the third count, and a third difference between the first difference and the second difference. The radar module determines variation in frequency of the signal based on the first count and the second count, and determines a type of radar present in the signal based on one or more of the third difference and the variation in the frequency of the signal.

22 Claims, 18 Drawing Sheets

(56) References Cited

U.S. PATENT DOCUMENTS

| | | | |
|---|---|---|---|
| 5,705,750 | A | 1/1998 | Mizukami et al. |
| 5,748,670 | A | 5/1998 | Zastrow |
| 5,867,533 | A | 2/1999 | Fleek et al. |
| 6,023,615 | A | 2/2000 | Bruckert et al. |
| 6,087,900 | A | 7/2000 | Lee et al. |
| 6,246,267 | B1 | 6/2001 | Barsoum et al. |
| 7,046,964 | B1 | 5/2006 | Sullivan et al. |
| 7,439,841 | B2 | 10/2008 | Kim |
| 7,528,656 | B2 | 5/2009 | Lee et al. |
| 2003/0107512 | A1 | 6/2003 | McFarland et al. |
| 2007/0290754 | A1 | 12/2007 | Lee et al. |
| 2008/0096516 | A1 | 4/2008 | Mun et al. |

FOREIGN PATENT DOCUMENTS

| | | |
|---|---|---|
| JP | 2005-168163 | 9/2005 |
| JP | 2005-241360 | 9/2005 |

OTHER PUBLICATIONS

IEE std 802.11a-1999 (Supplement to IEEE Std 802.11-1999) [Adopted by ISO/IEC and redesignated as ISO/IEC 8802-11: 1999/Amd 1:2000(E)]; Supplement to IEEE Standard for Information technology—Telecommunications and information exhange between systems—Local and metropolitan area networks—Specific requirements—Part 11: Wireless LAN Medium Access COntrol (MAC) and Physical Layer (PHY) specifications High-speed Physical Layer in the 5 GHz Band; LAN/MAN Standards Committe of the IEEE Computer Society; 91 pages.

IEEE Std 802.11b-1999 (Supplement to IEEE Std 802.11-1999 Edition); Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: Higher-Speed Physical Layer Extension in the 2.4 GHz Band; LAN/MAN Standards Committee of the IEEE Computer Society; Sep. 16, IEEE-SA Standards Board; 96 pages.

IEEE Std 802.11b-1999/Cor Jan. 2001 (Corrigendum to IEEE Std 802.11-1999); IEEE Standard for Information technology—Telecommunications and information exchange between systems—Local and metropolitan area networks—Specific requirements—Part 11: Wireless LAN Medium Access Control (MAC) and Physical Layer (PHY) specifications Amendment 2: Higher-Speed Physical Layer (PHY) extension in the 2.4 GHz Band—Corrigendum 1; LAN/MAN Standards Committee of the IEEE Computer Society; Nov. 7, 2001; 23 pages.

IEEE Std 802.11g/D2.8, May 2002 (Supplement to ANSI/IEEE Std 802.11, 1999 Edition) DRAFT Supplement to STANDARD [for] Information Technology—Telecommunications and information exchange between systems—Local and metropolitan area networks—Specific requirements—Part 11: Wireless LAN Medium Access Control (MAC) and Physical Layer (PHY) specifications: Further Higher-Speed Physical Layer Extension in the 2.4 GHz Band; LAN/MAN Standards Committee of the IEEE Computer Society; 53 pages.

IEEE P802.11g/D8.2, Apr. 2003 (Supplement to ANSI/IEEE Std 802.11-1999(Reaff 2003)); DRAFT Supplement to STANDARD [for] Information Technology—Telecommunications and information exchange between systems—Local and metropolitan area networks—Specific requirements—Part 11: Wireless LAN Medium Access Control (MAC) and Physical Layer (PHY) specifications: Further Higher Data Rate Extension in the 2.4 GHz Band; LAN/MAN Standards Committee of the IEEE Computer Society; 69 pages.

IEEE Std 802.16/2004 (Revision of IEEE Std 802.16/2001) IEE Standard for Local and metropolitan area networks; Part 16: Air Interface for Fixed Broadband Wireless Access Systems; IEEE Computer Society and the IEEE Microwave Theory and Techniquest Society; Oct. 1, 2004; 893 pages.

IEEE 802.20-PD-06, IEEE p. 802.20 V14, Jul. 16, 2004, Draft 802.20 Permanent Document, System Requirements for IEEE 802.20 Mobile Broadband Wireless Access Systems—Version 14, 23 pages.

EPO Communication and Search Report date Jul. 17, 2009 for European Patent Application No. 06024208.8, 5 pgs.

Correspondence dated May 21, 2012 enclosing Notice of Reasons for Rejection from the Japan Patent Office for Application No. 2006-332097; 5 pages.

Office Action in corresponding Chinese Application No. 200610162087.8 dated Mar. 3, 2011.

Office Action for related TW Application No. 095146001; Jul. 24, 2013; 2 pages.

| Radar Bin Index | Pulse Width (PW) in µsec | Pulse Repetition Interval (PRI) in µsec |
|---|---|---|
| 1 | 1 | 1428 |
| 2 | 1-5 | 150-230 |
| 3 | 6-10 | 200-500 |
| 4 | 11-20 | 200-500 |

FIG. 4

DETECTION AND ESTIMATION OF RADIO FREQUENCY VARIATIONS

CROSS-REFERENCE TO RELATED APPLICATIONS

The present application is a continuation of U.S. patent application Ser. No. 12/825,775, filed on Jun. 29, 2010, which is a continuation of U.S. patent application Ser. No. 11/493,473 (now U.S. Pat. No. 7,747,222), filed on Jul. 26, 2006, which claims the benefit of U.S. Provisional Application No. 60/749,222, filed on Dec. 9, 2005. The entire disclosures of the above applications are incorporated herein by reference.

FIELD

The present disclosure relates to wireless networks, and more particularly to a system and method for detecting and measuring frequency variations in wireless signals.

BACKGROUND

The background description provided herein is for the purpose of generally presenting the context of the disclosure. Work of the presently named inventors, to the extent it is described in this background section, as well as aspects of the description which may not otherwise qualify as prior art at the time of filing, are neither expressly nor impliedly admitted as prior art against the present disclosure.

The I.E.E.E. has defined several different standards for configuring wireless networks and devices. For example, 802.11, 802.11(a), 802.11(b), 802.11(g), 802.11(h), 802.11(n), 802.16, and 802.20. According to these standards, wireless network devices may be operated in either an infrastructure mode or an ad-hoc mode.

In the infrastructure mode, the wireless network devices or client stations communicate with each other through an access point. In the ad-hoc mode, the wireless network devices communicate directly with each other and do not employ an access point. The term client station or mobile station may not necessarily mean that a wireless network device is actually mobile. For example, a desktop computer that is not mobile may incorporate a wireless network device and operate as a mobile station or client station.

Referring now to FIG. 1, a first wireless network 10 is illustrated in an infrastructure mode. The first wireless network 10 includes one or more client stations 12 and one or more access points (AP) 14. The client station 12 and the AP 14 transmit and receive wireless signals 16. The AP 14 is a node in a network 18. The network 18 may be a local area network (LAN), a wide area network (WAN), or another network configuration. The network 18 may include other nodes such as a server 20 and may be connected to a distributed communications system 22 such as the Internet.

Referring now to FIG. 2, a second wireless network 24 operates in an ad-hoc mode. The second wireless network 24 includes multiple client stations 26-1, 26-2, and 26-3 that transmit and receive wireless signals 28. The client stations 26-1, 26-2, and 26-3 collectively form a LAN and communicate directly with each other. The client stations 26-1, 26-2, and 26-3 are not necessarily connected to another network.

To minimize radio frequency (RF) interference, some wireless networks may operate in a 5 GHz band. However, regulatory requirements governing the use of the 5 GHz band vary from country to country. Some countries utilize the 5 GHz band for military radar communications. Therefore, wireless networks operating in the 5 GHz band generally employ dynamic frequency selection (DFS) to avoid interference with radar communications. A network device generally employs DFS to a different channel of the 5 GHz band to avoid interfering with radar communications.

In infrastructure mode, the AP 14 transmits beacons to inform the client stations 12 that the AP uses DFS. When the client stations 12 detect radar on a channel, the client stations 12 notify the AP 14. Based on this information, the AP 14 uses DFS to select the best channel for network communications that will not interfere with radar.

In ad-hoc mode, one client station may be designated as a DFS owner. The DFS owner is responsible for collecting reports from the other client stations. If any station in the ad-hoc network detects radar, the DFS owner uses DFS to select the best channel for network communications that does not interfere with radar. For example, if station 26-1 is the DFS owner, it will be responsible for collecting reports from stations 26-2 and 26-3. If any station 26-1, 26-2, and 26-3 detects radar, station 26-1 will used DFS to select the best channel and notify stations 26-2 and 26-3 to switch to that channel.

SUMMARY

A system comprises a sampling module, a counter module, and a frequency characteristic module. The sampling module samples radio frequency (RF) signals on a first channel for a first predetermined period and a second predetermined period that is subsequent to the first predetermined period. The counter module increments first and second counts when the samples collected during the first and second predetermined periods reverse polarity, respectively. The frequency characteristic module determines a frequency of the RF signal based on at least one of the first and the second counts and determines frequency variation of the RF signal based on the first and second counts. At least one of the first and second counts is equal to the frequency.

In another feature, the frequency characteristic module compares the first and second counts to determine the frequency variation. The frequency characteristic module determines that the RF signal is tone radar when the first and second counts are approximately equal.

In another feature, the sampling module samples the RF signals for a third predetermined period that is subsequent to the second predetermined period and wherein the counter module increments a third count when the samples collected during the third predetermined period reverse polarity.

In another feature, the system further comprises a derivative module that determines a first difference between the first and second counts and a second difference between the second and third counts. The derivative module determines a third difference between the first and second differences. The derivative module determines the first and second differences when the first, second, and third counts are greater than a predetermined threshold.

In another feature, the frequency characteristic module determines that the RF signal is chirp radar when the third difference is less than a predetermined threshold. The predetermined threshold is approximately zero.

In another feature, the frequency characteristic module determines that the RF signal is chirp radar when the third difference is approximately zero.

In another feature, the system further comprises a radar module that determines whether the RF signal is one of chirp radar and tone radar based on the frequency variation. The radar module determines that the RF signal is chirp radar when the frequency variation is linear. The radar module determines that the RF signal is tone radar when the frequency variation is approximately zero.

In another feature, the system further comprises a dynamic frequency selection (DFS) module that communicates with the radar module and that selects a second channel having a different frequency than the first channel when the radar module determines that the RF signal is one of chirp radar and tone radar.

In another feature, at least one of the samples is disregarded and excluded from the first and second counts when an absolute value of the at least one of the samples is less than a predetermined threshold.

In another feature, the predetermined threshold is approximately 0.1.

In another feature, the first and second periods are adjacent.

In another feature, the first, second, and third periods are adjacent.

In another feature, a wireless network device comprises the system.

In another feature, a radar detection device comprises the system.

In still other features, a method comprises sampling radio frequency (RF) signals on a first channel for a first predetermined period and a second predetermined period that is subsequent to the first predetermined period, incrementing first and second counts when the samples collected during the first and second predetermined periods reverse polarity, respectively, determining a frequency of the RF signal based on at least one of the first and the second counts, and determining frequency variation of the RF signal based on the first and second counts. At least one of the first and second counts is equal to the frequency.

In another feature, the method further comprises comparing the first and second counts to determine the frequency variation. The method further comprises determining that the RF signal is tone radar when the first and second counts are approximately equal.

In another feature, the method further comprises sampling the RF signals for a third predetermined period that is subsequent to the second predetermined period and incrementing a third count when the samples collected during the third predetermined period reverse polarity.

In another feature, the method further comprises determining a first difference between the first and second counts and a second difference between the second and third counts. The method further comprises determining a third difference between the first and second differences.

In another feature, the method further comprises determining the first and second differences when the first, second, and third counts are greater than a predetermined threshold.

In another feature, the method further comprises determining that the RF signal is chirp radar when the third difference is less than a predetermined threshold. The predetermined threshold is approximately zero.

In another feature, the method further comprises determining that the RF signal is chirp radar when the third difference is approximately zero.

In another feature, the method further comprises determining whether the RF signal is one of chirp radar and tone radar based on the frequency variation. The method further comprises determining that the RF signal is chirp radar when the frequency variation is linear. The method further comprises determining that the RF signal is tone radar when the frequency variation is approximately zero.

In another feature, the method further comprises selecting a second channel having a different frequency than the first channel when the RF signal is one of chirp radar and tone radar.

In another feature, the method further comprises disregarding and excluding at least one of the samples from the first and second counts when an absolute value of the at least one of the samples is less than a predetermined threshold.

In another feature, the predetermined threshold is approximately 0.1.

In another feature, the first and second periods are adjacent.

In another feature, the first, second, and third periods are adjacent.

In still other features, a system comprises sampling means for sampling radio frequency (RF) signals on a first channel for a first predetermined period and a second predetermined period that is subsequent to the first predetermined period. The system comprises counter means for incrementing first and second counts when the samples collected during the first and second predetermined periods reverse polarity, respectively. The system further comprises frequency characteristic means for determining a frequency of the RF signal based on at least one of the first and the second counts and determining frequency variation of the RF signal based on the first and second counts. At least one of the first and second counts is equal to the frequency.

In another feature, the frequency characteristic means compares the first and second counts to determine the frequency variation. The frequency characteristic means determines that the RF signal is tone radar when the first and second counts are approximately equal.

In another feature, the sampling means samples the RF signals for a third predetermined period that is subsequent to the second predetermined period and wherein the counter means increments a third count when the samples collected during the third predetermined period reverse polarity.

In another feature, the system further comprises derivative means for determining a first difference between the first and second counts and a second difference between the second and third counts. The derivative means determines a third difference between the first and second differences. The derivative means determines the first and second differences when the first, second, and third counts are greater than a predetermined threshold.

In another feature, the frequency characteristic means determines that the RF signal is chirp radar when the third difference is less than a predetermined threshold. The predetermined threshold is approximately zero.

In another feature, the frequency characteristic means determines that the RF signal is chirp radar when the third difference is approximately zero.

In another feature, the system further comprises radar means for determines whether the RF signal is one of chirp radar and tone radar based on the frequency variation. The radar means determines that the RF signal is chirp radar when the frequency variation is linear. The radar means determines that the RF signal is tone radar when the frequency variation is approximately zero.

In another feature, the system further comprises dynamic frequency selection (DFS) means for communicates with the radar means and selecting a second channel having a different frequency than the first channel when the radar means determines that the RF signal is one of chirp radar and tone radar.

In another feature, at least one of the samples is disregarded and excluded from the first and second counts when an absolute value of the at least one of the samples is less than a predetermined threshold.

In another feature, the predetermined threshold is approximately 0.1.

In another feature, the first and second periods are adjacent.

In another feature, the first, second, and third periods are adjacent.

In another feature, a wireless network device comprises the system.

In another feature, a radar detection device comprises the system.

In still other features, a computer program executed by a processor comprises sampling radio frequency (RF) signals on a first channel for a first predetermined period and a second predetermined period that is subsequent to the first predetermined period, incrementing first and second counts when the samples collected during the first and second predetermined periods reverse polarity, respectively, determining a frequency of the RF signal based on at least one of the first and the second counts, and determining frequency variation of the RF signal based on the first and second counts. At least one of the first and second counts is equal to the frequency.

In another feature, the computer program further comprises comparing the first and second counts to determine the frequency variation. The computer program further comprises determining that the RF signal is tone radar when the first and second counts are approximately equal.

In another feature, the computer program further comprises sampling the RF signals for a third predetermined period that is subsequent to the second predetermined period and incrementing a third count when the samples collected during the third predetermined period reverse polarity.

In another feature, the computer program further comprises determining a first difference between the first and second counts and a second difference between the second and third counts. The computer program further comprises determining a third difference between the first and second differences.

In another feature, the computer program further comprises determining the first and second differences when the first, second, and third counts are greater than a predetermined threshold.

In another feature, the computer program further comprises determining that the RF signal is chirp radar when the third difference is less than a predetermined threshold. The predetermined threshold is approximately zero.

In another feature, the computer program further comprises determining that the RF signal is chirp radar when the third difference is approximately zero.

In another feature, the computer program further comprises determining whether the RF signal is one of chirp radar and tone radar based on the frequency variation. The computer program further comprises determining that the RF signal is chirp radar when the frequency variation is linear. The computer program further comprises determining that the RF signal is tone radar when the frequency variation is approximately zero.

In another feature, the computer program further comprises selecting a second channel having a different frequency than the first channel when the RF signal is one of chirp radar and tone radar.

In another feature, the computer program further comprises disregarding and excluding at least one of the samples from the first and second counts when an absolute value of the at least one of the samples is less than a predetermined threshold.

In another feature, the predetermined threshold is approximately 0.1.

In another feature, the first and second periods are adjacent.

In another feature, the first, second, and third periods are adjacent.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 4 lists parameters of various exemplary short-pulse radar signals that may be used to detect radar and perform DFS;

DETAILED DESCRIPTION

Figure 1:
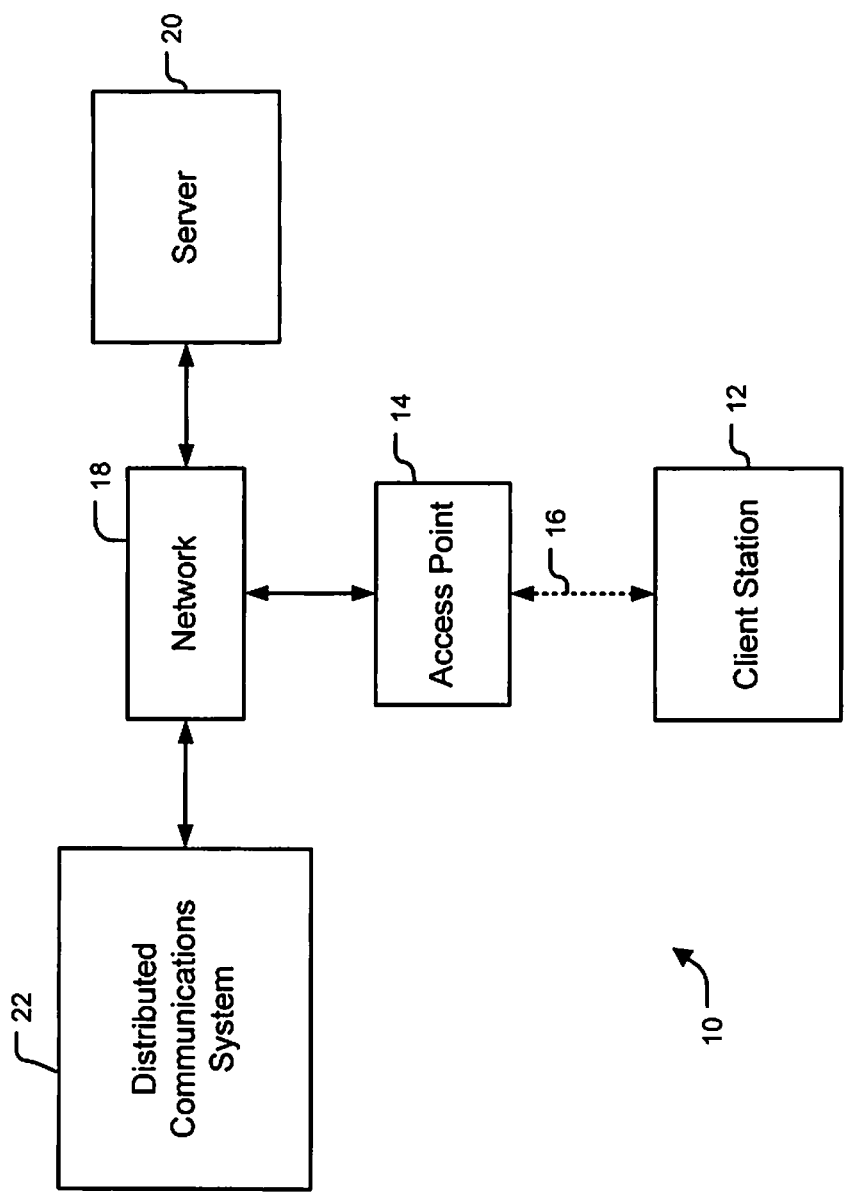
FIG. 1 is functional block diagram of a wireless network operating in an infrastructure mode according to the prior art.
Figure 2:
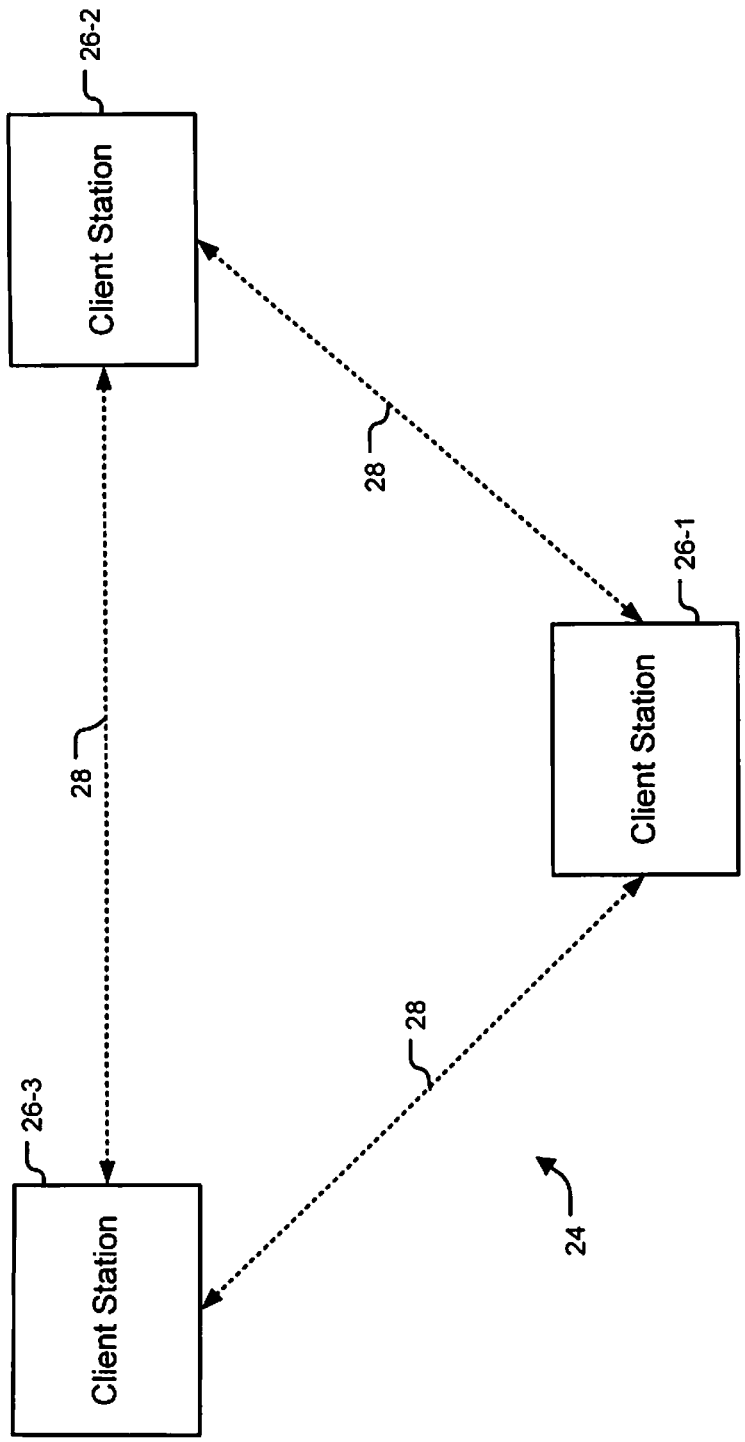
FIG. 2 is a function block diagram of a wireless network operating in an ad-hoc mode according to the prior art.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Dynamic frequency selection (DFS) is typically used to avoid interference between radar signals and wireless network communication systems operating in the 5 GHz band. More specifically, DFS is used to select a radar-free channel for wireless network communication from multiple non-overlapping channels in the 5.25-5.35 GHz and 5.47-5.725 GHz frequency ranges.

Figure 3:
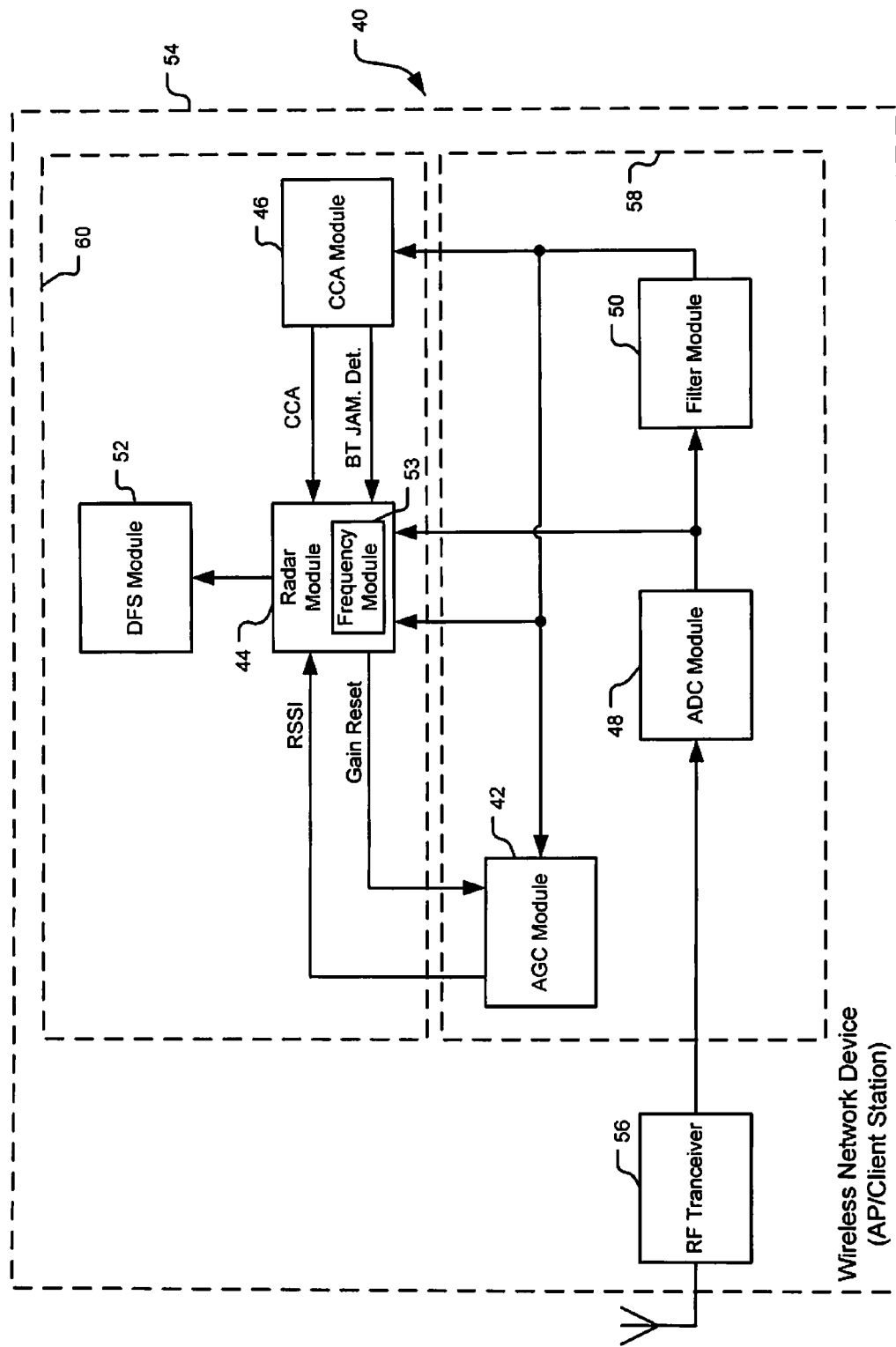
FIG. 3 a functional block diagram of an exemplary system for detecting radar and performing DFS in a wireless network according to the present disclosure.

Referring now to FIG. 3, a system 40 for radar detection and DFS may include an automatic gain control (AGC) module 42, a radar module 44, a clear channel assessment (CCA) module 46, an analog-to-digital converter (ADC) module 48, a filter module 50, and a dynamic frequency selection (DFS) module 52.

The AGC module 42 provides a radio signal strength indicator (RSSI) measurement to the radar module 44. Based on RSSI, the radar module 44 determines if a radio frequency (RF) signal is stronger than a predetermined threshold $DFS_{th}$ such as −64 dBm. The CCA module 46 distinguishes legitimate wireless data packets from other signals and activates the radar module 44 when the RF signal is not a legitimate wireless data packet. The radar module 44 measures parameters of the RF signal such as pulse width, frequency, frequency variation, etc. More specifically, the radar module 44 may include a frequency module 53 that measures frequency and frequency variation of an RF signal. The DFS module 52 may compare the parameters measured by the radar module 44 with a set of parameters of known types of radar signals. The system 40 may switch to a different channel if the RF signal is a radar signal of a known type.

The system 40 may be implemented in a wireless network device 54 such as an access point or a client station. The wireless network device 54 typically includes an RF transceiver module 56, a baseband processor (BBP) module 58, and a medium access controller (MAC) module (or a control module) 60.

The RF transceiver 56 receives RF signals. The BBP module 58 demodulates, digitizes, and filters the RF signal. The BBP module 58 may include the AGC module 42, the ADC module 48, and the filter module 50. The control module 60 may include the radar module 44, the CCA module 46, and the DFS module 52.

In some implementations, the radar module 44, the CCA module 46, and the DFS module 52 may be implemented in the BBP module 58 of the wireless network device 54. In still other implementations, at least one of the modules may be implemented by firmware and/or software. Although shown separately for illustrative purposes, at least one of the modules shown in FIG. 3 may be implemented using a single module.

Additionally, the system 40 may be implemented in any other devices and/or systems that may be used to detect radar. Although the disclosure explains how the system 40 may be used to detect chirp radar, a skilled artisan may use the system 40 to detect and measure frequency variations in signals other than radar.

Radar signals may be generally classified into three categories: short-pulse radar signals, long-pulse or chirp radar signals, and frequency-hopping radar signals. A table in FIG. 4 lists sample parameters for four exemplary short-pulse radar signals. In a chirp radar signal, the frequency of the carrier is linearly varied within radar pulses. For example, a typical chirp radar signal may have a pulse width (PW) of 50-100 µS, a pulse repetition interval (PRI) of 1-2 mS, and a chirp width of 5-20 MHz. A typical frequency-hopping radar signal may have a PW of 1 µS, a PRI of 333 µS, and 9 pulses per hop. Parameter values of radar signals used in actual applications may vary.

Figure 5A:
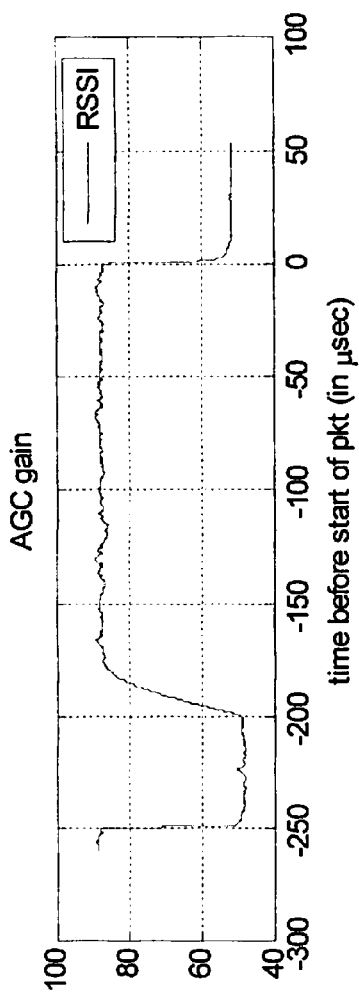
FIG. 5A depicts an exemplary response of AGC gain to a chirp radar pulse followed by a wireless data packet.
Figure 5B:
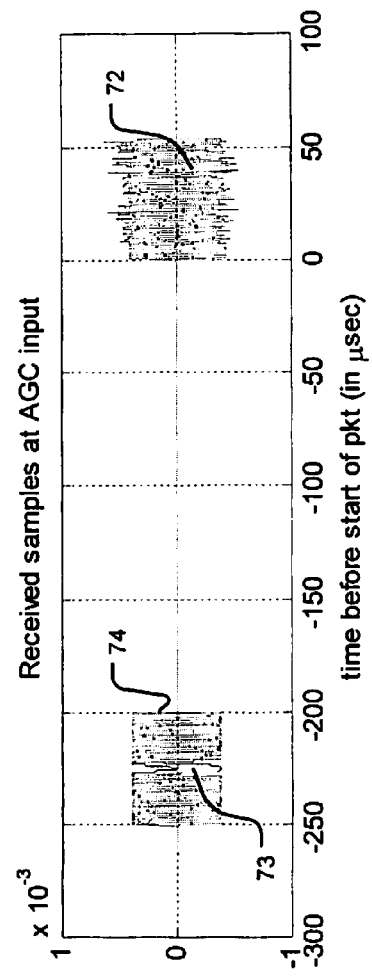
FIG. 5B depicts exemplary samples of a chirp radar pulse and a wireless data packet received by an analog-to-digital converter (ADC) when automatic gain control (AGC) is off.
Figure 6A:
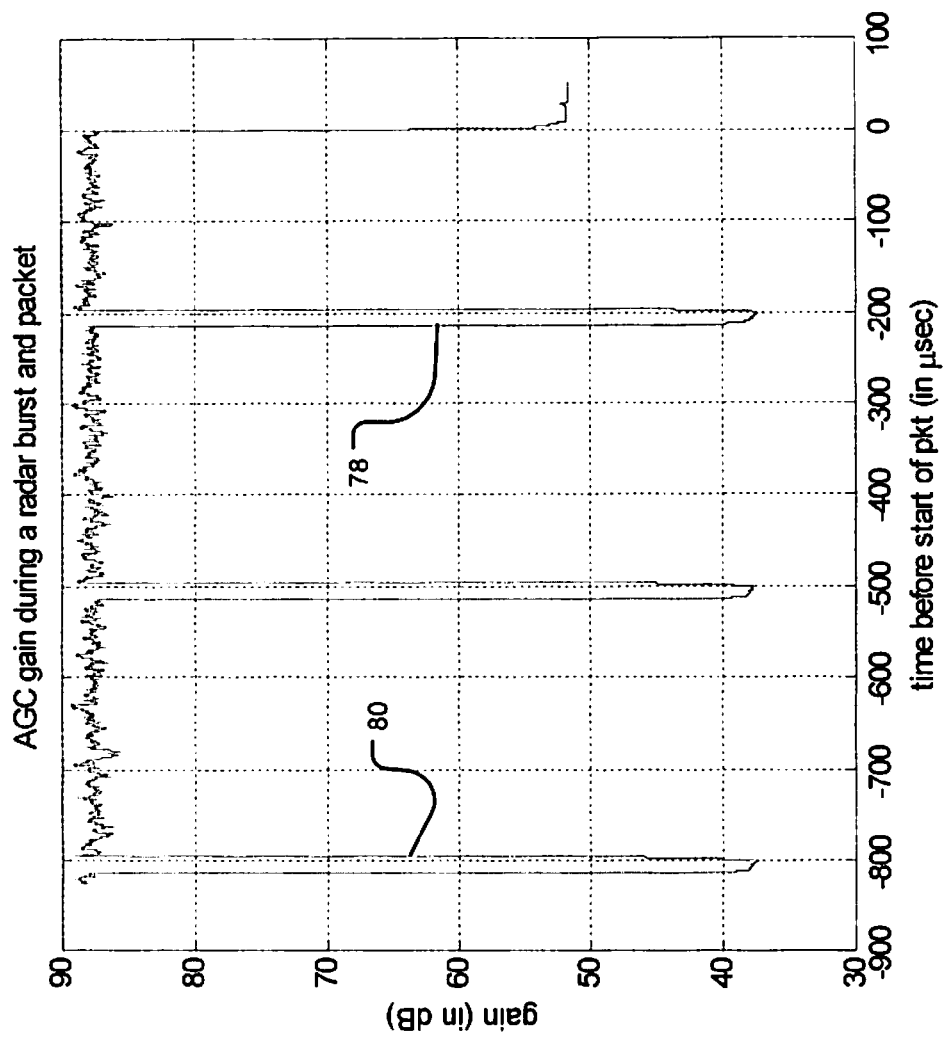
FIG. 6A depicts an exemplary response of AGC gain to a burst of three radar pulses followed by a wireless data packet.
Figure 6B:
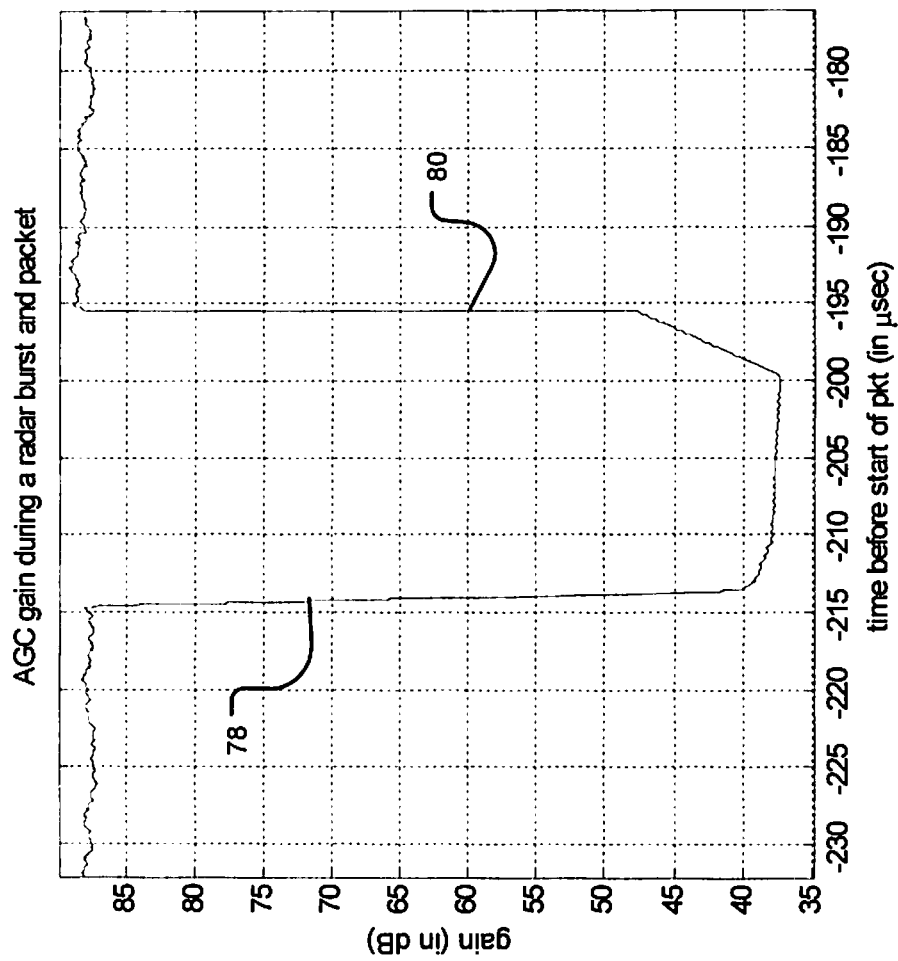
FIG. 6B depicts an exemplary decrease and increase in AGC gain in response to a radar pulse.

Referring now to FIGS. 5A-6B, a response of AGC gain to different types of radar signals is depicted. FIG. 5A depicts a response of AGC gain to a chirp radar pulse followed by a wireless data packet. FIG. 5B depicts exemplary samples of a chirp radar pulse 74 and a wireless data packet 72 received by the ADC module 48 when the AGC is off. FIG. 5B also depicts a variation 73 in the signal input to the ADC module 48, when the AGC is off, corresponding to a varying frequency of chirp radar. FIG. 6A depicts a response of AGC gain to a burst of three radar pulses followed by a wireless data packet. FIG. 6B depicts in detail a decrease 78 and an increase 80 in AGC gain in response to a radar pulse.

When the RF transceiver 56 receives an RF signal, the gain of the AGC module 42 typically decreases to a value that is less than a normal value. The gain of the AGC module 42 may return to the normal value after a period of time. The time taken by the gain of the AGC module 42 to return to the normal value depends on various parameters of the RF signal such as signal strength, pulse width, frequency, etc. The AGC module 42 uses a radio signal strength indicator (RSSI) to communicate the strength of the RF signal to the radar module 44. If RSSI exceeds a threshold value $DFS_{th}$ such as −64 dBm, the radar module 44 may perform radar detection.

The CCA module 46 may determine whether the RF signal is a legitimate wireless data packet. A preamble in a legitimate wireless data packet includes a standard sequence. The CCA module 46 performs a correlation on the sequence in the preamble to determine whether the RF signal is a legitimate wireless data packet. The CCA module 46 uses a CCA signal to activate the radar module 44 when the RF signal is not a legitimate wireless data packet. Thus, the CCA module 46 may prevent false triggering of the radar module 44. More specifically, the CCA module 46 may prevent the radar module 44 from performing radar detection and DFS when the RF signal is a legitimate wireless data packet. In addition, the CCA module 46 may prevent the radar module 44 from being falsely triggered by Bluetooth jammers.

The ADC module 48 converts the RF signal from an analog to a digital format. When the RF signal is no longer being received, the output of the ADC decreases to a low value. The radar module 44 monitors the output of the ADC module 48. When the output of the ADC module 48 decreases below a predetermined threshold and remains below the predetermined threshold for a period of time, the radar module 44 detects an ADC under-run condition. The ADC under-run condition indicates an end of a pulse of the RF signal. The radar module 44 determines characteristics of the RF signal such as pulse width (PW), frequency, frequency variation, etc., based on the ADC under-run condition.

The filter module 50 typically includes a low-pass filter that filters the output of the ADC module 48. The radar module 44 determines whether the RF signal is single tone radar or chirp radar based on the output of the filter module 50. More specifically, the frequency module 53 determines the frequency and frequency variation of the RF signal. The frequency module 53 determines characteristics of the RF signal based on the frequency variation. The characteristics of the RF signal may be used to determine whether the RF signal is single tone radar or chirp radar.

The radar module 44 determines parameters of the RF signal such as pulse width, frequency, frequency characteristics (e.g., chirp frequency, single tone frequency, etc.), and pulse repetition interval (PRI). The DFS module 52 compares the parameters determined by the radar module 44 to the exemplary parameters shown in the table in FIG. 4 to determine whether the RF signal is a radar signal of a known type.

When the signal strength of the RF signal exceeds $DFS_{th}$ and when the CCA module 46 indicates that the RF signal is not a legitimate wireless data packet, the radar module 44 measures pulse width of every pulse of the RF. More specifically, the radar module 44 determines a beginning of a pulse based on the RSSI signal generated by the AGC module 42. The RSSI signal indicates a beginning of a pulse when the AGC gain crosses the −64 dBm threshold. An end of a pulse is indicated by the ADC under-run condition detected by the radar module 44 at the end of every pulse. The radar module 44 calculates the pulse width of the pulse by counting a difference between the time of the beginning of the pulse and the time of the end of the pulse.

Additionally, after receiving the ADC under-run signal at the end of the pulse, the radar module 44 generates a signal to reset the gain of the AGC module 42 to the normal value. Unless reset, the gain of the AGC module 42 may take longer to return to the normal value, and incoming data during that time period may be lost.

Figure 7:
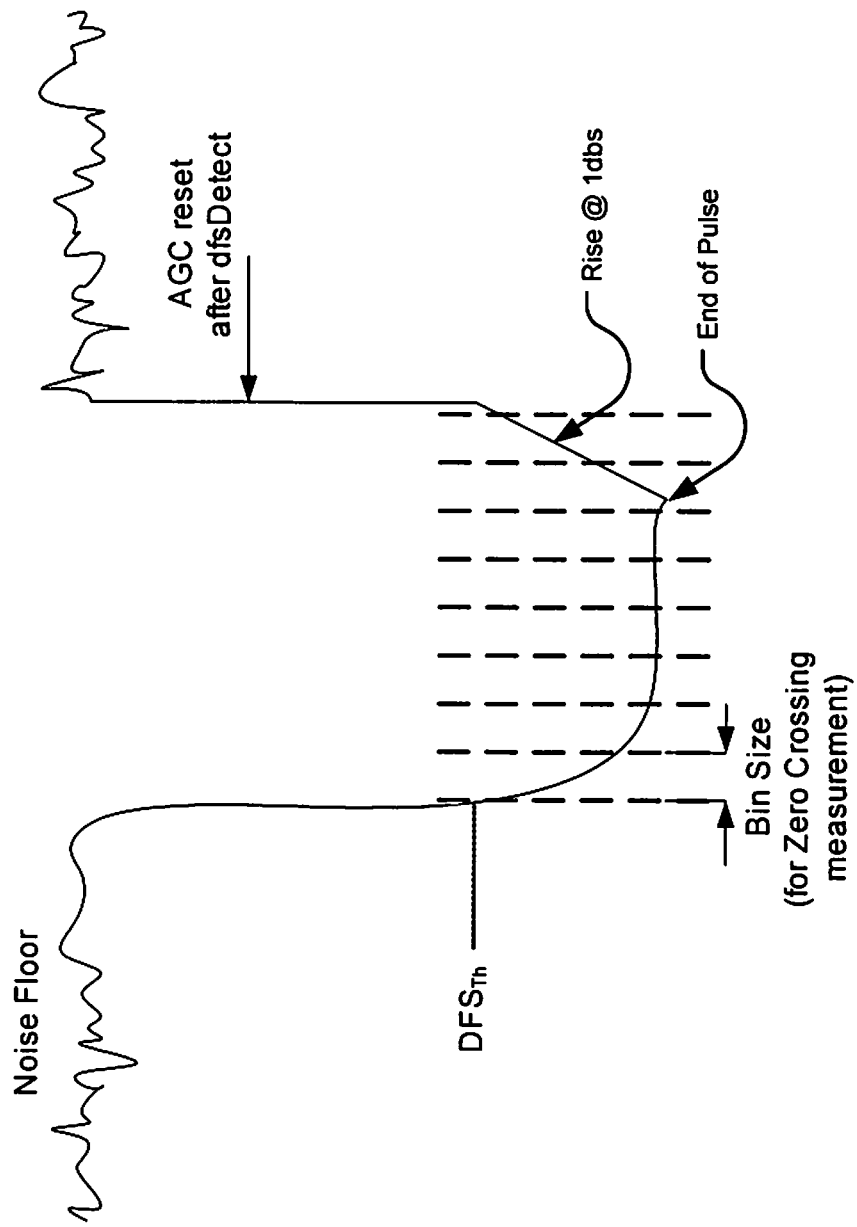
FIG. 7 depicts an exemplary method for measuring frequency of a radar pulse.

Referring now to FIG. 7, the frequency module 53 measures the frequency of the RF signal to determine characteristics of the signal. As previously mention, the characteristics may be used to determine whether the RF signal is a single tone radar signal or a chirp radar signal. The frequency module 53 divides a baseband signal into bins of equal periods. The period of each bin is proportional to the resolution of the frequency measurement. In some implementations, the frequency module 53 may determine the frequency of the RF signal when the gain of the AGC module 42 decreases below a predetermined threshold $DFS_{th}$ (typically −64 dBm).

The frequency module 53 determines the frequency of the RF signal for each bin. More specifically, the frequency module 53 counts zero-crossings for each bin to determine the frequency. By counting the number of zero-crossings, the frequency module 53 may utilize less resources than more complex methods that use Fourier transforms (e.g., DFT, FFT).

Figure 8:
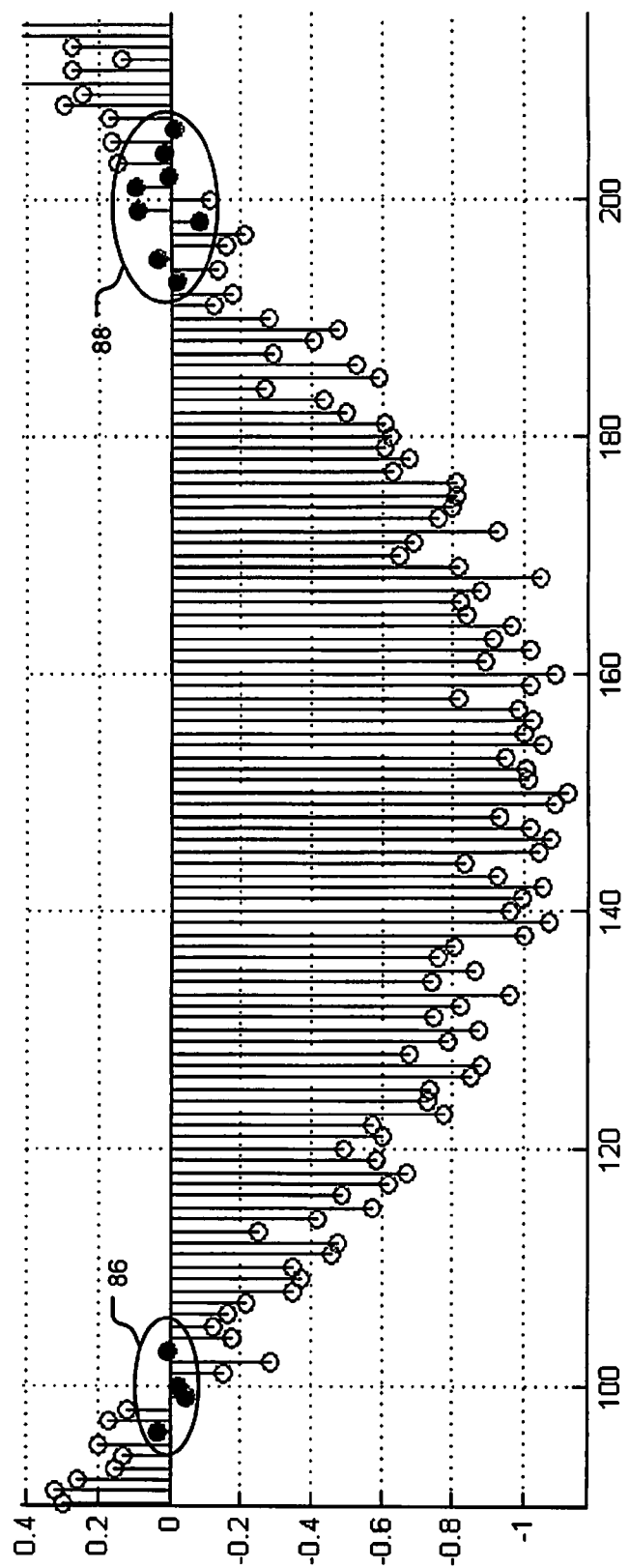
FIG. 8 is a graph depicting data samples of a baseband signal versus time.

Referring now to FIG. 8, a graph depicting data samples of the baseband signal versus time is shown. Due to noise in the RF signal, the sampled data may have multiple zero-crossings like those generally depicted at 86 and 88. However, the baseband signal may have only two true zero-crossings as shown in FIG. 8. Therefore, the frequency module 53 only counts zero-crossings of data samples that have an absolute value (ABS) greater than a predetermined ABS threshold. By counting data samples that have an absolute value greater than the ABS threshold, the frequency module 53 may count two zero-crossings rather than ten zero-crossings for the baseband signal shown in FIG. 8. In some implementations, the ABS threshold may be 0.1, although other thresholds may be used.

Figure 9:
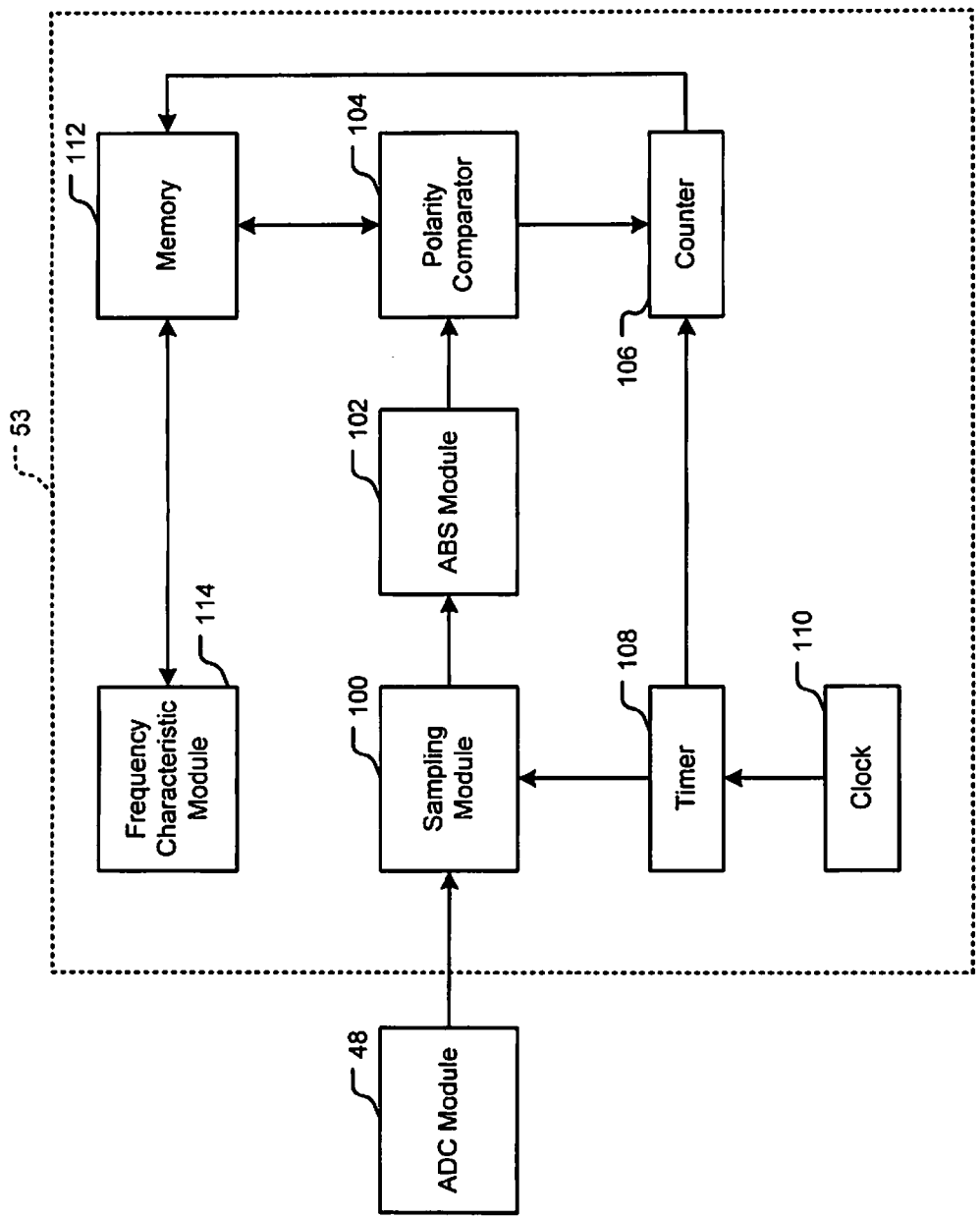
FIG. 9 is an exemplary functional block diagram of a frequency module of the system depicted in FIG. 3.

Referring now to FIG. 9, an exemplary implementation of the frequency module 53 is depicted. The frequency module 53 may include a sampling module 100, an ABS module 102, a polarity comparator 104, a counter 106, a timer 108, a clock 110, memory 112, and a frequency characteristic module 114.

The sampling module 100 may communicate with the ADC module 48, the ABS module 102, and the timer 108. The polarity comparator 104 may communicate with the ABS module 102, the counter 106, and memory 112. The counter 106 may communicate with the timer 108 and memory 112. The clock 110 may communicate with the timer 108.

The clock 110 may periodically set the timer 108 to count down from a predetermined time. The predetermined time may correspond with the period of the bin. While the timer 108 is counting down, the sampling module 100 may collect data samples from the ADC module 48. The ABS module 102 may receive the samples from the sampling module 100 and discard samples that have an absolute value less than the ABS threshold. The polarity comparator 104 compares the remaining samples to a previous sample stored in memory 112. If the polarity of the previous sample is opposite of the sample, a zero-crossing has occurred. When a zero-crossing occurs, the polarity comparator 104 directs the counter 106 to increment a count total and stores the sample in memory 112. The counter 106 stores the count total in memory 112 when the timer 108 expires. The count total sampled during the predetermined time generally corresponds to the frequency of the RF signal for each bin.

The frequency characteristic module 114 may communicate with memory 112 and determine frequency characteristics of the count totals (or frequencies) stored in memory 112. More specifically, the frequency characteristic module 114 compares the frequencies of each bin and determines whether the frequencies vary according to a predetermined pattern. For example, if the frequencies vary according to a linear pattern, the RF signal may be chirp radar. If the frequencies are substantially the same from bin to bin, the RF signal may be tone radar.

Figure 10:
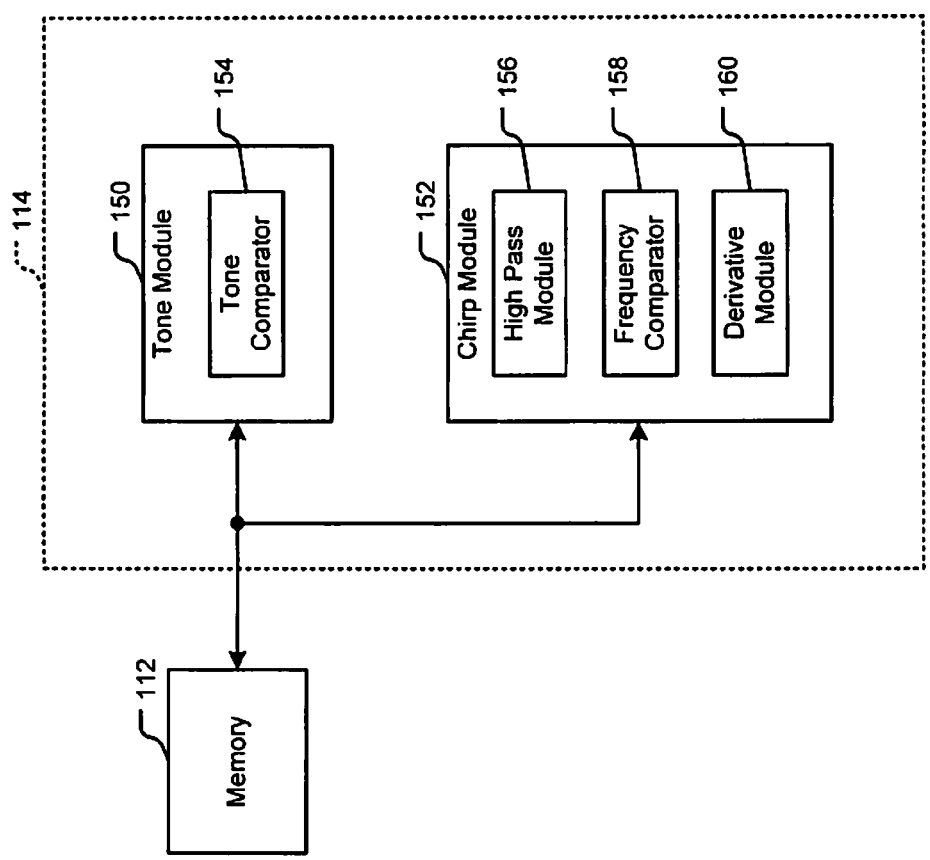
FIG. 10 is an exemplary functional block diagram of a frequency characteristic module of the frequency module of FIG. 9.

Referring now to FIG. 10, an exemplary implementation of the frequency characteristic module 114 is depicted. The frequency characteristic module 114 may include a tone module 150 and a chirp module 152. The tone module 114 may determine whether the RF signal is tone radar, and the chirp module 152 may determine whether the RF signal is chirp radar. Although this example only includes the tone and chirp modules 150, 152, other modules may be included to determine other frequency variation characteristics of the RF signal.

The tone module 150 may include a tone comparator 154. The tone comparator 154 may compare the frequencies of each bin stored in memory 112. If the frequencies are substantially the same, the tone module 150 may determine the RF signal to be tone. To determine whether the frequencies are substantially the same, the tone comparator 154 may also compare the variation of each bin to a tone threshold.

Figure 11:
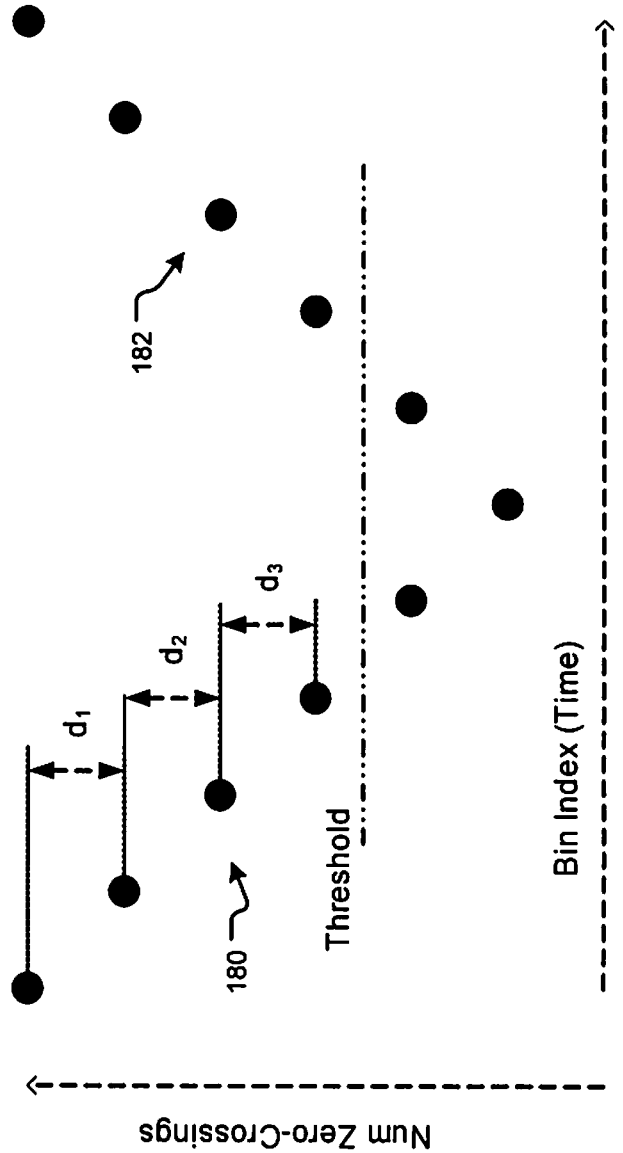
FIG. 11 is graph of number of zero-crossings in a bin as a function of number of bins when chirp radar pulses are centered at a center frequency of a frequency measuring device.

The chirp module 152 determines whether the frequency of the RF signal varies linearly, in which case the RF signal may be chirp radar. FIG. 11 depicts evenly distributed zero-crossings where pulses of chirp radar are centered at a center frequency of a DFS-enabled device receiving the chirp radar signal. Chirp radar may include a down-chirp as generally depicted at 180 and an up-chirp as generally depicted at 182. Since the down-chirp and up-chirp are linear in nature, the chirp module 152 may determine that the RF signal is chirp radar when the pattern is linear.

Figure 12:
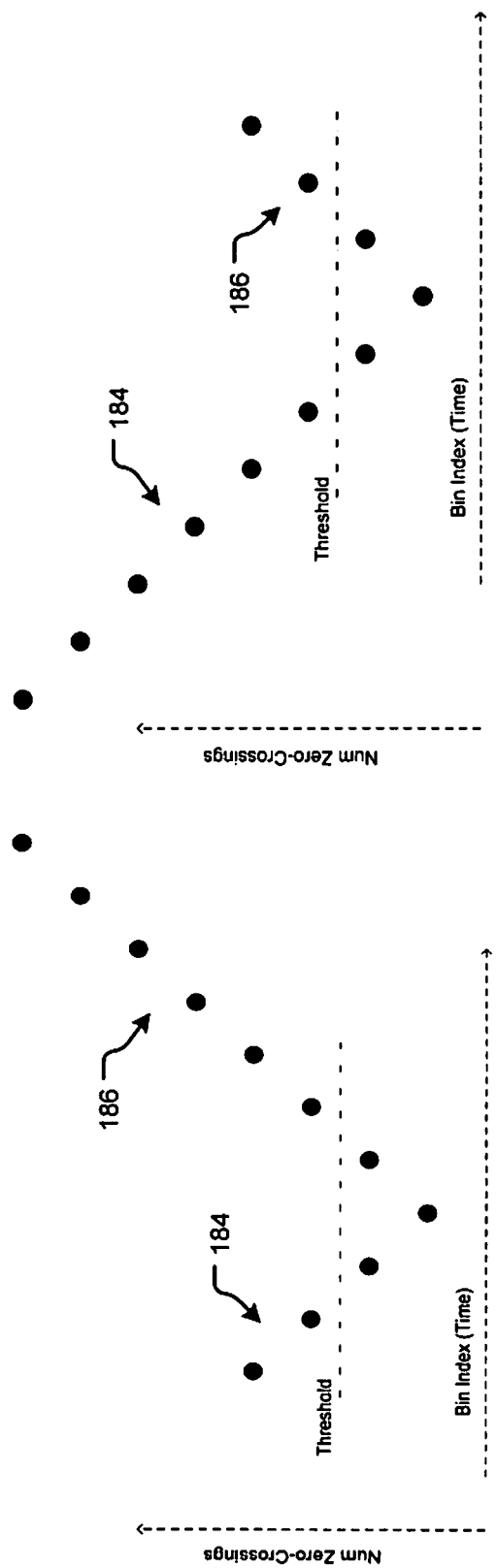
FIG. 12 is graph of number of zero-crossings in a bin as a function of number of bins when chirp radar pulses are not centered at a center frequency of a frequency measuring device.

FIG. 12 depicts unevenly distributed zero crossings where pulses of chirp radar are not centered at the center frequency of the DFS-enabled device receiving the radar signal. As with FIG. 11, chirp radar that is not centered at the center frequency is also linear in nature. Down-chirps of the RF signal are generally depicted at 184 and up-chirps are generally depicted at 186.

Referring back to FIG. 10, the chirp module 152 may include a high pass module 156, a chirp comparator 158, and a derivative module 160. Bins that have a low frequency may be sensitive to random noise and are excluded when determining the frequency characteristics. Therefore, the high pass module 156 may be used to remove bins with a frequency less than a frequency threshold from consideration when determining the frequency variation.

The derivative module 160 may approximate a first and second derivative of the frequencies of each bin stored in memory 112. The second derivative may be used to determine whether the frequency variation is linear. More specifically, if the second derivative is approximately zero, the frequency variation is linear. If the frequency variation is linear, the chirp module 152 may determine that the RF signal is chirp radar due to the linear characteristics of chirp radar.

To determine the first and second derivatives of the frequencies, the derivative module 160 may use difference equations. The first derivative may be determined with the following equation:

$$d_i = |z_i - z_{i+1}|$$

where $d_i$ is the first derivative, $z_i$ is the frequency in a current bin, and $z_{i+1}$ is the frequency in the next bin. The second derivative may be determined with the following equation:

$$s = |d_i - d_{i+1}|$$

where s is the second derivative, $d_i$ is the first derivative of the frequency in a current bin, and $d_{i+1}$ is the first derivative of the frequency in the next bin.

The chirp comparator 158 determines whether the second derivative is approximately zero. More specifically, the chirp comparator 158 may compare the second derivative of the frequencies to a chirp threshold that is slightly greater than zero. If the second derivative is less than the chirp threshold, then the second derivative is approximately zero. If the second derivative is approximately zero, the chirp module 150 may determine RF signal to be chirp radar.

Figure 13:
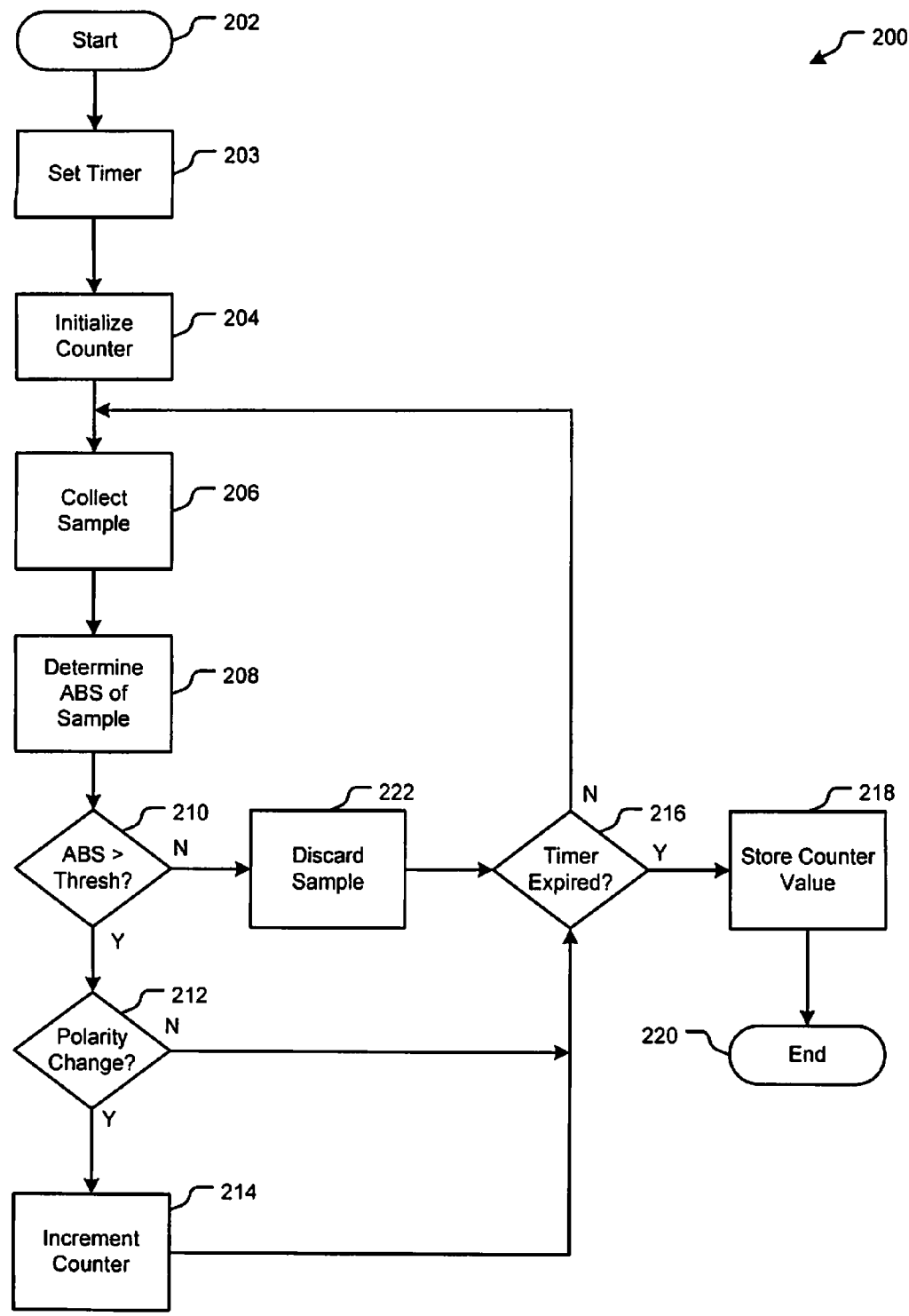
FIG. 13 is a flowchart depicted exemplary steps taken by the frequency module of FIG. 3.

Referring now to FIG. 13, exemplary steps taken by the frequency module 53 to determine the frequency of the RF signal are generally depicted at 200. The process starts in step 202 when the RF transceiver 56 receives the RF signal. In step 203, the clock 110 sets the timer 108 to countdown from a predetermined time. In step 204, the counter 106 is initialized to zero. The sampling module 100 collects data samples from the ADC module 48 in step 206.

In step 208, the ABS module 102 determines an absolute value of the samples. The ABS module 102 determines whether the absolute value of the sample is greater than the ABS threshold in step 210. If the absolute value of the sample is greater than the ABS threshold, the polarity comparator 104 determines whether the polarity of the sample has transitioned in step 212. If the polarity of the sample has transitioned, the counter 106 increments in step 214. In step 216, the frequency module 53 determines whether the timer 108 has expired. If the timer 108 has expired, the value that the counter 106 has incremented to is stored in memory 112 in step 218 and the process ends in step 220. If the timer 108 has not expired, the process returns to step 206.

If the ABS module 102 determines that the absolute value of the sample is not greater than the ABS threshold in step 210, the ABS module 102 discards the sample in step 222. The frequency module 53 determines whether the timer 108 has expired in step 216. If the timer 108 has expired, the value that the counter 106 has incremented to is stored in memory 112 in step 218 and the process ends in step 220. If the timer 108 has not expired, the process returns to step 206.

If the polarity comparator 104 determines that the polarity of the sample has not transitioned in step 212, the frequency module 53 determines whether the timer 108 has expired in step 216. If the timer 108 has expired, the value that the counter 106 has incremented to is stored in memory 112 in step 218 and the process ends in step 220. If the timer 108 has not expired, the process returns to step 206.

Figure 14:
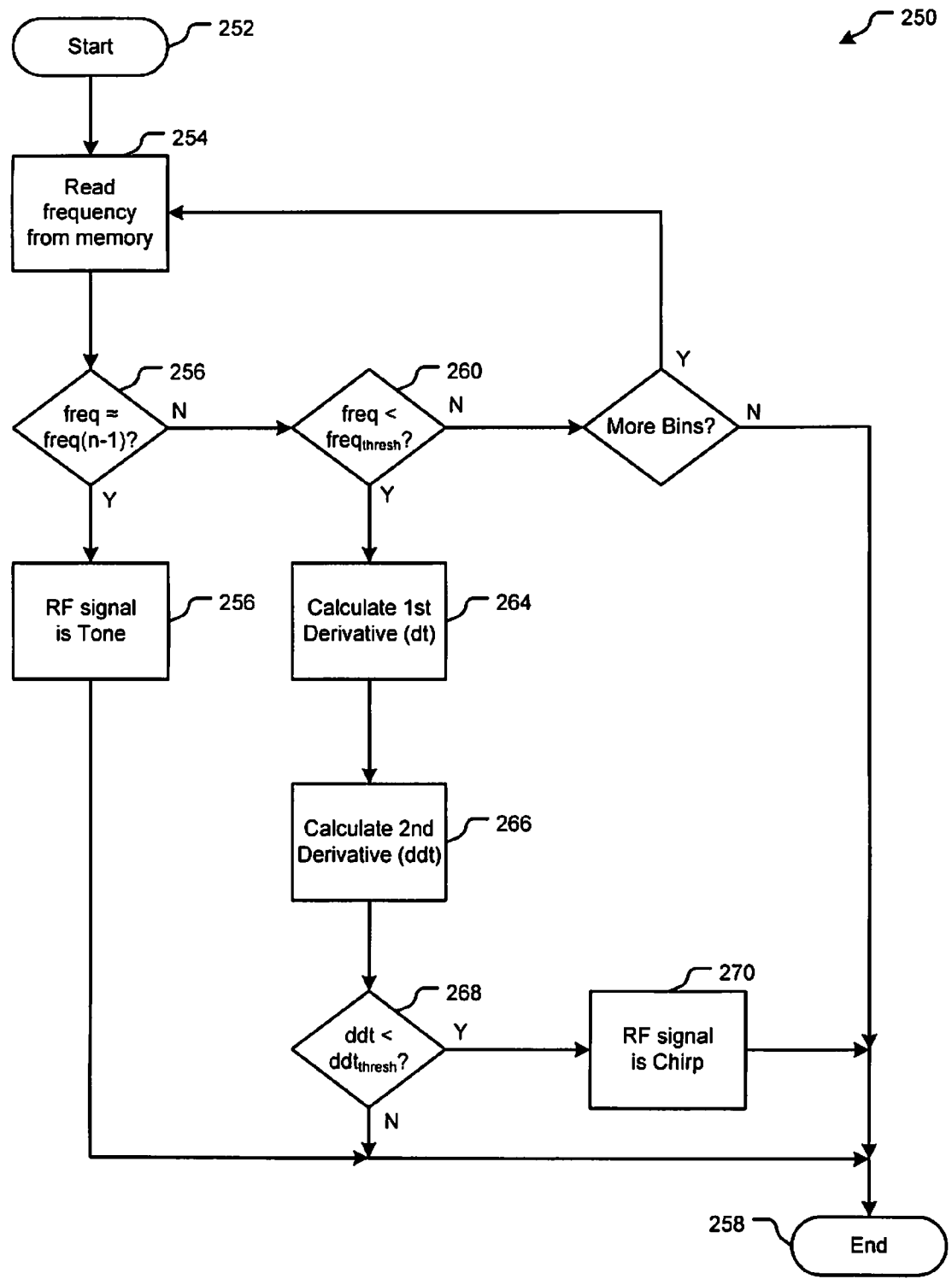
FIG. 14 is a flowchart depicting exemplary steps taken by the frequency characteristic module of FIG. 9.

Referring now to FIG. 14, exemplary steps taken by the frequency characteristic module 114 to determine whether the frequencies stored in memory vary according to a particular pattern are generally depicted at 250. The process begins in step 252. In step 253, the frequency characteristic module 114 reads the frequency of a bin from memory 122. In step 254, the tone comparator 154 determines whether the frequencies are substantially the same from bin to bin. More specifically, the tone comparator 154 compares the frequency read from memory 122 to a frequency that was previously read from memory. If the frequencies from bin to bin are substantially the same, the tone module 150 may determine that the RF signal is tone radar in step 256 and the process ends in step 258.

If the tone comparator 154 determines that the frequencies are not substantially the same from bin to bin in step 254, the frequency comparator 156 determines whether the frequency is greater than a frequency threshold in step 260. If the frequency is not greater than the frequency threshold, the frequency characteristic module 114 determines whether there are more bins in memory 112 in step 262. If there are more bins in memory 112, the frequency module 114 reads the frequency of the next bin stored in memory 112 in step 253.

If the frequency comparator 156 determines that the frequency is greater than the frequency threshold, the derivative module 160 determines the first derivative in step 264 and the second derivative in step 266. In step 268, the chirp comparator 158 determines whether the second derivative is less than the chirp threshold. If the second derivative is less than the chirp threshold, the chirp module 152 determines that the RF signal is chirp radar in step 270 and the process ends in step 258. If the second derivative is not less than the chirp threshold, the process ends in step 258.

Figure 15A:
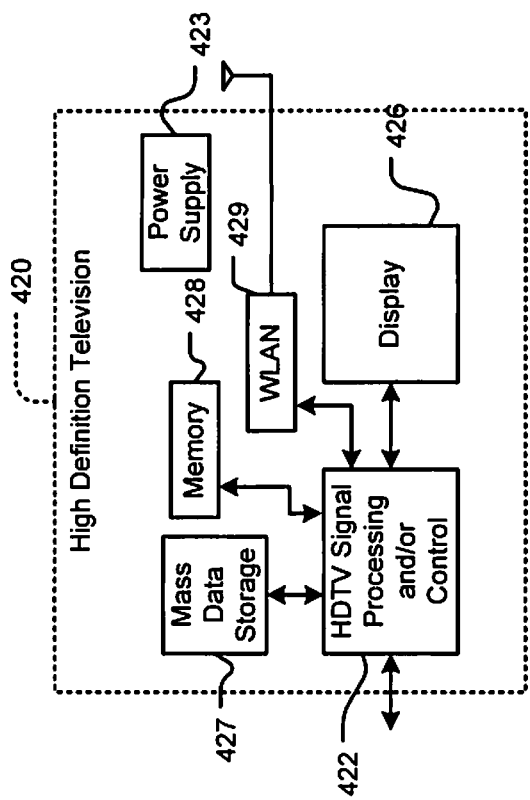
FIG. 15A is a functional block diagram of a high definition television.

Referring now to FIGS. 15A-15D, various exemplary implementations of the system 40 are shown. Referring now to FIG. 15A, the system 40 can be implemented in signal processing and/or control circuits 422 of a high definition television (HDTV) 420. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner in devices such as optical and/or magnetic storage devices. The devices may include, for example, hard disk drives HDD and/or DVDs. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Figure 15B:
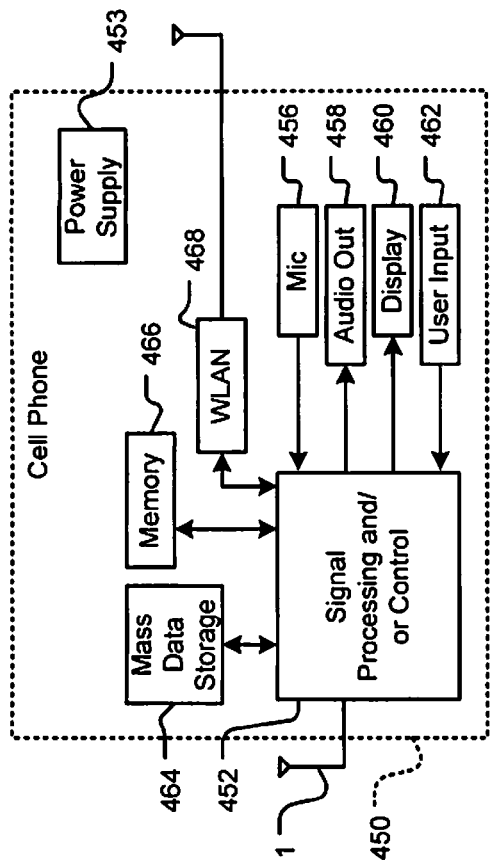
FIG. 15B is a functional block diagram of a cellular phone.

Referring now to FIG. 15B, the system 40 can be implemented in signal processing and/or control circuits 452 of a cellular phone 450 that may include a cellular antenna 451. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner in devices such as optical and/or magnetic storage devices. The devices may include, for example, hard disk drives HDD and/or DVDs. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 15C:
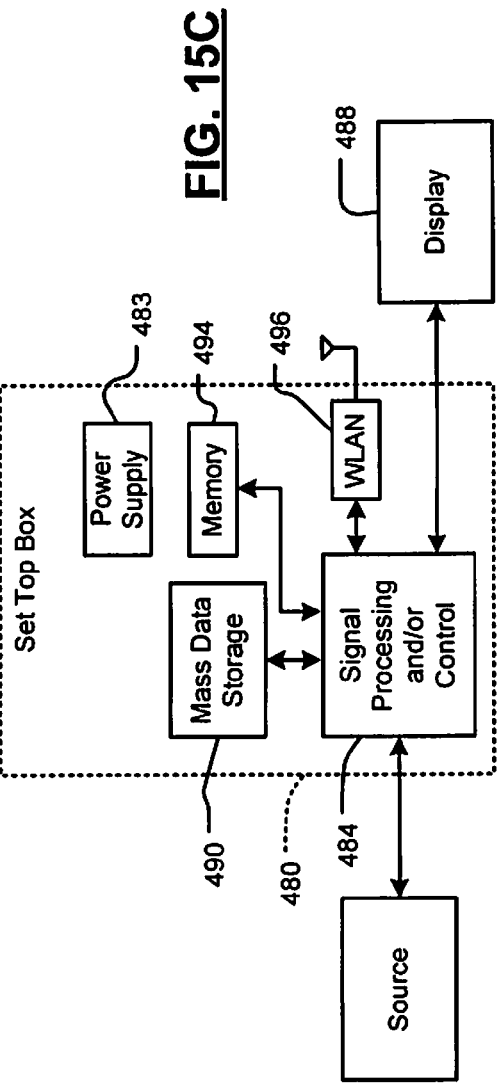
FIG. 15C is a functional block diagram of a set top box.

Referring now to FIG. 15C, the system 40 can be implemented in signal processing and/or control circuits 484 of a set top box 480. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices such as hard disk drives HDD and/or DVDs. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496.

Figure 15D:
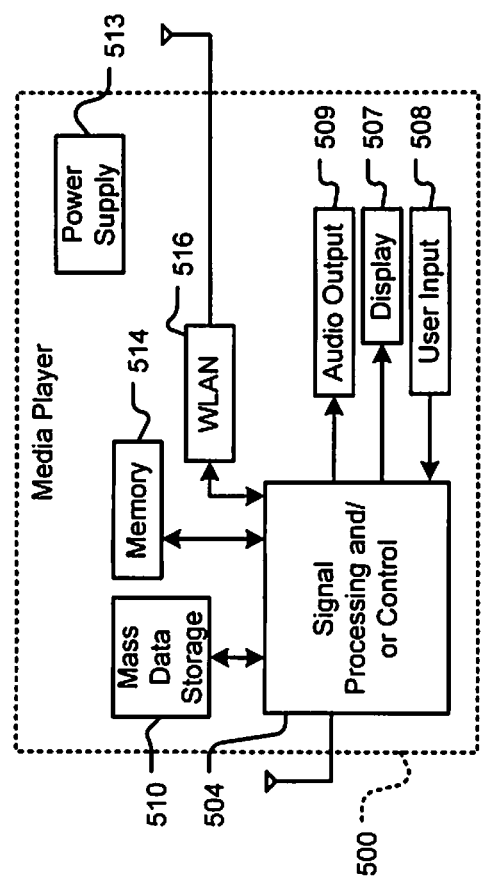
FIG. 15D is a functional block diagram of a media player.

Referring now to FIG. 15D, the system 40 can be implemented in signal processing and/or control circuits 504 of a media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices such as hard disk drives HDD and/or DVDs. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A system comprising:
 a counting module configured to
   count polarity reversals of samples of a signal, wherein the samples are generated during (i) a first period, (ii) a second period, and (iii) a third period, and
   generate (i) a first count, (ii) a second count, and (iii) a third count of the polarity reversals counted during the respective periods;
 a difference module configured to determine
   a first difference between (i) the first count and (ii) the second count,
   a second difference between (i) the second count and (ii) the third count, and
   a third difference between (i) the first difference and (ii) the second difference; and
 a radar module configured to
   determine variation in frequency of the signal based on (i) the first count and (ii) the second count, and
   determine a type of radar present in the signal based on one or more of (i) the third difference and (ii) the variation in the frequency of the signal.

2. The system of claim 1, wherein the radar module is configured to determine that the type of radar present in the signal is chirp radar in response to the third difference being less than a predetermined threshold.

3. The system of claim 1, wherein the radar module is configured to determine that the type of radar present in the signal is tone radar in response to the variation in the frequency of the signal being less than a predetermined value.

4. The system of claim 2, wherein:
 the predetermined threshold includes a first predetermined threshold, and
 the difference module is configured to determine the first difference and the second difference in response to the first count, the second count, and the third count being greater than a second predetermined threshold.

5. The system of claim 2, wherein the predetermined threshold is zero.

6. The system of claim 1, wherein the radar module is configured to determine that the type of radar present in the signal is chirp radar in response to the third difference being zero.

7. The system of claim 1, wherein the radar module is configured to determine that the type of radar present in the signal is chirp radar or tone radar based on the variation in the frequency of the signal.

8. The system of claim 7, wherein the radar module is configured to determine that the type of radar present in the signal is chirp radar in response to the variation in the frequency of the signal being linear.

9. The system of claim 7, wherein the radar module is configured to determine that the type of radar present in the signal is tone radar in response to the variation in the frequency of the signal being zero.

10. The system of claim 1, wherein the difference module is configured to exclude one or more of the samples from one or more of (i) the first count and (ii) the second count in response to an absolute value of the one or more of the samples being less than a predetermined threshold.

11. A wireless network device comprising:
the system of claim 1, wherein the wireless network device is configured to receive the signal while communicating in a first channel; and
a dynamic frequency selection module configured to switch to a second channel in response to the radar module determining that radar is present in the signal.

12. A method comprising:
counting polarity reversals of samples of a signal received by a wireless network device, wherein the samples are generated during (i) a first period, (ii) a second period, and (iii) a third period; and
generating (i) a first count, (ii) a second count, and (iii) a third count of the polarity reversals counted during the respective periods;
generating a first difference between (i) the first count and (ii) the second count;
generating a second difference between (i) the second count and (ii) the third count;
generating a third difference between (i) the first difference and (ii) the second difference;
determining a frequency of the signal based on one or more of (i) the first count and (ii) the second count;
determining variation in the frequency of the signal based on (i) the first count and (ii) the second count; and
determining (a) whether radar is present in the signal, and in response to radar being present in the signal, (b) a type of radar present in the signal received by the wireless network device based on one or more of (i) the third difference and (ii) the variation in the frequency of the signal.

13. The method of claim 12, further comprising determining that the type of radar present in the signal is chirp radar in response to the third difference being less than a predetermined threshold.

14. The method of claim 12, further comprising determining that the type of radar present in the signal is tone radar in response to the variation in the frequency of the signal being less than a predetermined value.

15. The method of claim 13, wherein the predetermined threshold includes a first predetermined threshold, the method further comprising:
determining the first difference and the second difference in response to the first count, the second count, and the third count being greater than a second predetermined threshold.

16. The method of claim 13, wherein the predetermined threshold is zero.

17. The method of claim 12, further comprising determining that the type of radar present in the signal is chirp radar in response to the third difference being zero.

18. The method of claim 12, further comprising determining that the type of radar present in the signal is chirp radar or tone radar based on the variation in the frequency of the signal.

19. The method of claim 18, further comprising determining that the type of radar present in the signal is chirp radar in response to the variation in the frequency of the signal being linear.

20. The method of claim 18, further comprising determining that the type of radar present in the signal is tone radar in response to the variation in the frequency of the signal being zero.

21. The method of claim 12, further comprising excluding one or more of the samples from one or more of (i) the first count and (ii) the second count in response to an absolute value of the one or more of the samples being less than a predetermined threshold.

22. The method of claim 12, wherein the wireless network device is configured to receive the signal while communicating in a first channel, the method further comprising:
switching to a second channel in response to determining that radar is present in the signal.

* * * * *